(12) United States Patent
Loibl et al.

(10) Patent No.: US 10,966,330 B2
(45) Date of Patent: Mar. 30, 2021

(54) CONTROL UNIT

(71) Applicant: ZF Friedrichshafen AG, Friedrichshafen (DE)

(72) Inventors: Josef Loibl, Bad Abbach (DE); Christoph Braun, Uhldingen-Muehlhofen (DE)

(73) Assignee: ZF FRIEDRICHSHAFEN AG, Friedrichshafen (DE)

(*) Notice: Subject to any disclaimer, the term of this patent is extended or adjusted under 35 U.S.C. 154(b) by 0 days.

(21) Appl. No.: 16/083,601

(22) PCT Filed: Feb. 23, 2017

(86) PCT No.: PCT/EP2017/054112
§ 371 (c)(1),
(2) Date: Sep. 10, 2018

(87) PCT Pub. No.: WO2017/153174
PCT Pub. Date: Sep. 14, 2017

(65) Prior Publication Data
US 2019/0082545 A1 Mar. 14, 2019

(30) Foreign Application Priority Data
Mar. 8, 2016 (DE) .................... 10 2016 203 718.8

(51) Int. Cl.
*H05K 5/00* (2006.01)
*F16H 61/00* (2006.01)
(Continued)

(52) U.S. Cl.
CPC ....... *H05K 5/0082* (2013.01); *B60R 16/0239* (2013.01); *F16H 61/0003* (2013.01);
(Continued)

(58) Field of Classification Search
CPC ............. H05K 5/0082; H05K 7/20854; H05K 5/0069; H05K 5/0034; F16H 61/0006;
(Continued)

(56) References Cited

U.S. PATENT DOCUMENTS 5,737,188 A 4/1998 Flierl et al.
5,749,060 A 5/1998 Graf et al.
(Continued)

FOREIGN PATENT DOCUMENTS

DE 43 34 595 C1 4/1995
DE 195 15 622 A1 11/1996
(Continued)

OTHER PUBLICATIONS

International Search Report for PCT/EP2017/054112, dated May 22, 2017, 7p, in German Language.
(Continued)

*Primary Examiner* — Hung S. Bui
*Assistant Examiner* — Sagar Shrestha
(74) *Attorney, Agent, or Firm* — Brinks Gilson & Lione

(57) ABSTRACT

A control unit is provided, in particular a transmission control unit, which is designed to be attached to an outer side or to an inner side of a housing, in particular to a transmission housing, wherein the control unit comprises a circuit board as well as at least one plug which is arranged on the circuit board and whose pins are connected to corresponding conducting paths of the circuit board, which is arranged in such a way that it reaches into an opening within the housing and to produce an electrical and/or signal connection between the outer side and the inner side of the housing via conducting paths that are arranged on the circuit board, wherein an overmolding is enclosing at least the circuit board and the plug(s).

20 Claims, 4 Drawing Sheets

(51) Int. Cl.
    *B60R 16/023* (2006.01)
    *H05K 7/20* (2006.01)
    *F16H 57/00* (2012.01)
(52) U.S. Cl.
    CPC ....... *F16H 61/0006* (2013.01); *H05K 5/0069* (2013.01); *H05K 7/20854* (2013.01); *F16H 2057/005* (2013.01); *H05K 5/0034* (2013.01)
(58) Field of Classification Search
    CPC ........... F16H 61/0003; F16H 2057/005; B60R 16/0239
    USPC ......................................... 361/736, 748, 752
    See application file for complete search history.

(56) References Cited

U.S. PATENT DOCUMENTS

| | | | |
|---|---|---|---|
| 5,823,070 A * | 10/1998 | Taniguchi | F16H 61/0006 74/606 R |
| 5,909,915 A | 6/1999 | Okuda | |
| 6,307,749 B1 | 10/2001 | Daanen et al. | |
| 7,712,395 B2 * | 5/2010 | Suzuki | F16H 57/04 74/606 R |
| 8,256,326 B2 | 9/2012 | Murakami et al. | |
| 8,286,532 B2 * | 10/2012 | Konig | F16H 61/0006 74/606 R |
| 10,527,160 B2 * | 1/2020 | Yokota | F16H 61/0006 |
| 2002/0088304 A1 * | 7/2002 | Thorum | F16D 25/12 74/606 R |
| 2002/0148631 A1 | 10/2002 | Albert et al. | |
| 2006/0023426 A1 * | 2/2006 | Murakami | B60R 16/0239 361/715 |
| 2006/0075848 A1 * | 4/2006 | Suzuki | B60R 16/0207 74/606 R |
| 2006/0219050 A1 * | 10/2006 | Morise | F16H 61/0006 74/606 R |
| 2007/0078036 A1 * | 4/2007 | Morise | F16H 57/0421 475/159 |
| 2007/0141451 A1 * | 6/2007 | Marukawa | B60R 16/04 429/100 |
| 2010/0229677 A1 * | 9/2010 | Murakami | F16H 61/0006 74/606 R |
| 2011/0228478 A1 * | 9/2011 | Takata | F16H 61/0006 361/699 |
| 2012/0127677 A1 * | 5/2012 | Wakana | H05K 5/0069 361/752 |
| 2013/0066514 A1 * | 3/2013 | Das | G07C 5/008 701/31.5 |
| 2018/0020558 A1 * | 1/2018 | Saito | B60R 16/02 |
| 2018/0354434 A1 * | 12/2018 | Kaneko | B60R 16/005 |

FOREIGN PATENT DOCUMENTS

| | | |
|---|---|---|
| DE | 198 48 732 A1 | 4/2000 |
| DE | 696 06 253 T2 | 6/2000 |
| DE | 199 55 603 C1 | 2/2001 |
| DE | 101 34 053 A1 | 2/2003 |
| DE | 10 2006 001 890 A1 | 8/2007 |
| DE | 11 2007 001 716 T5 | 5/2009 |
| DE | 11 2008 000 873 T5 | 4/2010 |

OTHER PUBLICATIONS

International Search Report for PCT/EP2017/054112, dated May 22, 2017, 3p, in English.
Written Opinion of the International Searching Authority for PCT/EP2017/054112, dated May 22, 2017, 7p, in German Language.
German Office Action for Application DE 10 2016 203 718.8, dated Nov. 10, 2016, 10p, in German Language (with English translation of p. 8).

* cited by examiner

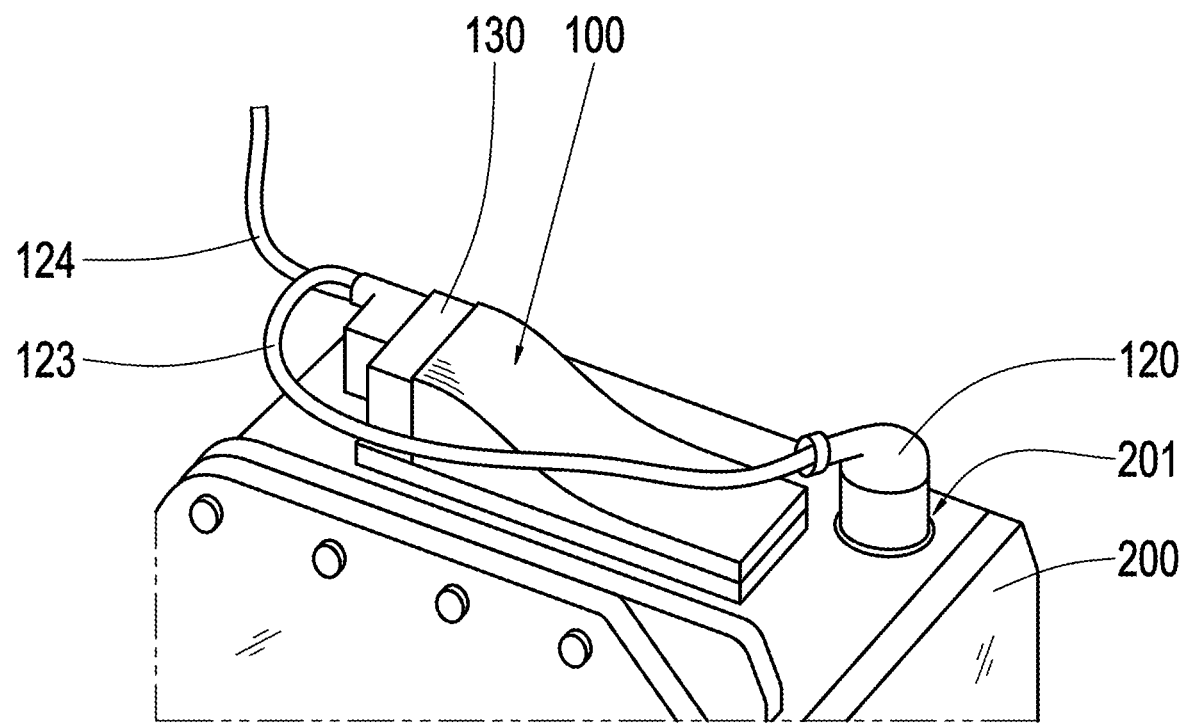
State of the Art    Fig. 1
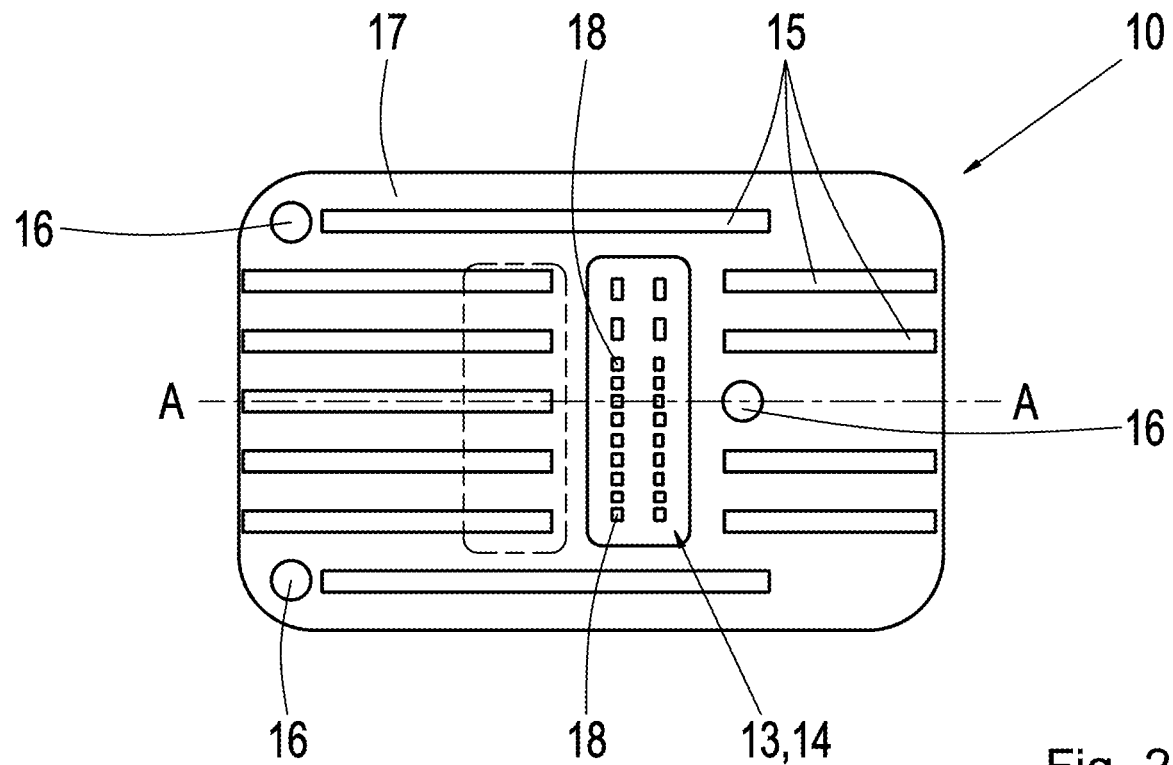
Fig. 2

CONTROL UNIT

This application is a filing under 35 U.S.C. § 371 of International Patent Application PCT/EP2017/054112, filed Feb. 23, 2017, and claims the priority of DE 10 2016 203 718.8, filed Mar. 8, 2016. These applications are incorporated by reference herein in their entirety.

The present disclosure relates to a control unit according to the preamble of claim 1.

The controlling of functions in a motor vehicle, such as the controlling of automatic transmissions, lighting functions, engine functions, etc. is increasingly carried out by means of control units, e.g. electronic control units such as electronic transmission controls and similar so-called ECU's (electronic control unit). Integrated control units, as well as devices that can be attached and removed are known from the prior art. The advantage of devices that can be attached and removed is that they themselves are relatively cost-efficient in their development and production due to a low number of components for the control unit. However, additional components are necessary in order to make a controlling of e.g. a motor vehicle possible. These components are e.g. cables, cable harnesses or plug connectors.

Electronic control units are furthermore subject to the permanent trend that their prices decrease or have to decrease while they maintain or increase their functionality. This requires a further development of existing solutions or the use of novel concepts.

In current series applications, control units with a classic construction, i.e. with a populated circuit carrier including housing and plug, as (control) device that can be added to a unit, are screwed onto e.g. an automatic transmission. Two cable sets running towards the transmission and towards the motor vehicle are connected via two plug connectors.

In turn, on the side of the transmission, the connection to components within the transmission, e.g. to sensors, valves, engines, is carried out via plug connectors. The cable sets hereby pose a noteworthy portion of the costs in such a system.

From the DE 199 55 603 C1, a transmission control unit on the inside of a transmission housing is known, in which a plug arrangement is positioned on a flexible circuit carrier, which is inserted into a housing opening of the transmission by means of a plug connector.

It is thus an objective of this disclosure, to present a structural concept for electronic control units, which solve the above-mentioned problems. In particular the structural design including the scope of the cable connections is to be simplified to a significant degree.

This objective is achieved in line with the disclosure by means of the characteristics of the independent patent claim. Advantageous embodiments are subject-matter of the dependent claims.

In accordance with the disclosure, a control unit is proposed, in particular a transmission control unit, which is designed to be attached on an outer side or an inner side of a housing, in particular of a transmission housing, wherein the control unit comprises a circuit board as well as at least one plug which is arranged on the circuit board and whose pins are directly connected to corresponding conducting paths of the circuit board, which is arranged in such a way that it protrudes into an opening within the housing and to produce an electrical and/or signal connection between the outer side and the inner side of the housing via conducting paths that are arranged on the circuit board, wherein an overmolding is enclosing at least the circuit board and the plug(s).

In one embodiment, the control unit is arranged on the outer side of the housing and the connector is on the transmission side. Advantageously, the circuit board on the side that is opposite to the transmission sided plug features a plug on the motor vehicle side, which is connected to the transmission sided plug via the conducting paths.

In an alternative embodiment, the control unit is arranged on the inner side of the housing and the plug is on the motor vehicle side. Advantageously, the circuit board on the side that is opposite to the motor vehicle sided plug features a plug on the transmission side, which is connected to the motor vehicle sided plug via the conducting paths. In another alternative embodiment, the conducting paths of the control unit that are connected to the plug on the motor vehicle side are advantageously directly connected to the transmission sided components.

Advantageously, the connection between the conducting paths and the components in the housing interior is carried out by means of soldering, pressing, welding and/or the components within the housing interior comprise signal connections, in particular bus connections, in particular of sensors, actuators, valves and/or motors, and/or a voltage or power supply.

The arrangement that a plug of the control unit establishes a connection towards the inner side of the housing through an existing opening in the housing, does not only make it possible to reduce cable strands, but also creates more space to incorporate further components. Due to the possibility of being flexible regarding whether to arrange the control unit on the inner or outer side of the housing makes it possible to react to individual situations for the installation and even allows that already existing systems can be upgraded.

Advantageously, an overmolding surrounds at least the circuit board and the plug(s), in order to guarantee protection against external influences.

The plug that protrudes through the opening in the housing is advantageously enclosed by means of a sealing, in particular by one or more O-rings or by means of a molded seal that is injected into a groove in the overmolding, in order to guarantee an additional sealing against e.g. fluids.

The circuit board advantageously comprises electric and/or electronic components that are fitted onto it, and a cooling device, in particular a cooling plate, is arranged in the vicinity of the electric and/or electronic components on the side of the circuit board that faces towards the housing. By means of the cooling plate that is directly adjacent to the housing, an efficient heat dissipation can also be achieved via the housing, so that the electric and/or electronic components can be better protected against a damaging by means of heat.

Further characteristics and advantages of the disclosure can be derived from the following description of design forms of the disclosure, by means of the figures of the drawing, which depicts disclosure related details and from the claims. The individual characteristics can be implemented individually in each respective case or as a plurality in any desired combination for any variation of the disclosure.

Preferred embodiments of the disclosure are explained in more detail in the following by means of the attached drawing.

FIG. 1 shows a depiction of a control unit according to the prior art that is installed on a transmission housing.

FIG. 2 shows a top view of a control unit from one side according to an embodiment of the present disclosure.

In the following description of the figures, identical elements or functions are provided with the same reference signs.

Figure 3:
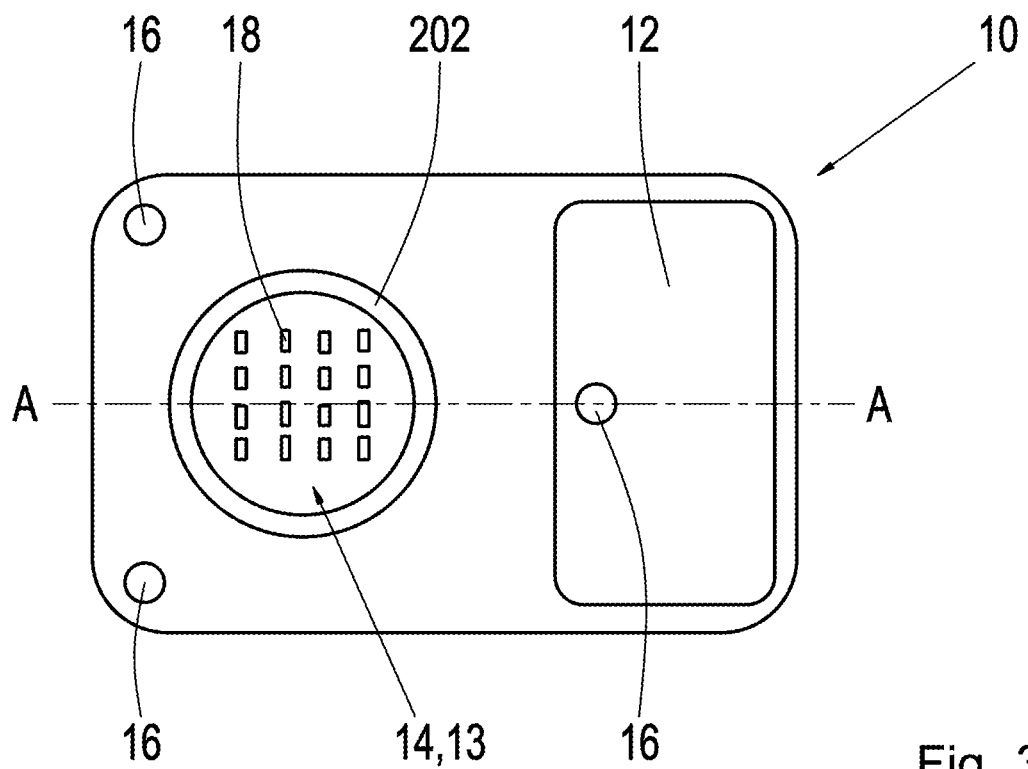
FIG. 3 shows a top view of a control unit from the opposite side of the one shown in FIG. 2 according to an embodiment of the present disclosure.

FIG. 1 shows a depiction of a control unit 100 according to the prior art that is installed at a transmission housing 200. The control unit 100 is usually a populated circuit carrier with a housing and plug 130 and is screwed onto e.g. a unit as attachable control unit 100, e.g. to an automatic transmission, or to a corresponding housing 200. Two cable sets running towards the transmission 123 and towards the motor vehicle 124 are herein connected via two plug connectors to plug 130. In turn, on the side of the transmission, the connection to components within the transmission, e.g. to sensors, valves, engines, is carried out by means of a plug connector 120 via the opening for the plug 201 within housing 200.

The basic idea of the present disclosure is to select a design concept for a control unit 100, in which the control unit is installed in close vicinity to an opening for the plug 201 of a unit, e.g. an automatic transmission or another transmission, or a transmission housing 200 at its outer or inner side. It is also possible to arrange for an additional opening in the housing, in case e.g. none of the existing openings can be used. Both, the transmission sided as well as the motor vehicle sided plug or cable set are integrated into the control unit. The electronic unit can also be implemented by means of technologies with minimum space requirements, e.g. by means of a highly integrated chipset on a circuit board, resulting in a very compact control unit, which requires very little installation space.

Particular attention is given to the use as a device that can be attached at or as an integrated module within the transmission.

FIG. 2 shows a top view of a control unit 10 from one side according to an embodiment of the present disclosure. In this embodiment, control unit 10 can be attached to housing 200, e.g. a transmission housing, from the outer side or from the inner side.

In the embodiment in which control unit 10 is arranged on the outer side on housing 200, i.e. on the outer side of the transmission, i.e. on the motor vehicle side, the depicted side of the control unit is herein the side that is facing away from the housing surface 200, i.e. the plug is the motor vehicle sided plug 13. This is shown in the FIGS. 5 and 6 and described later.

Figure 7:
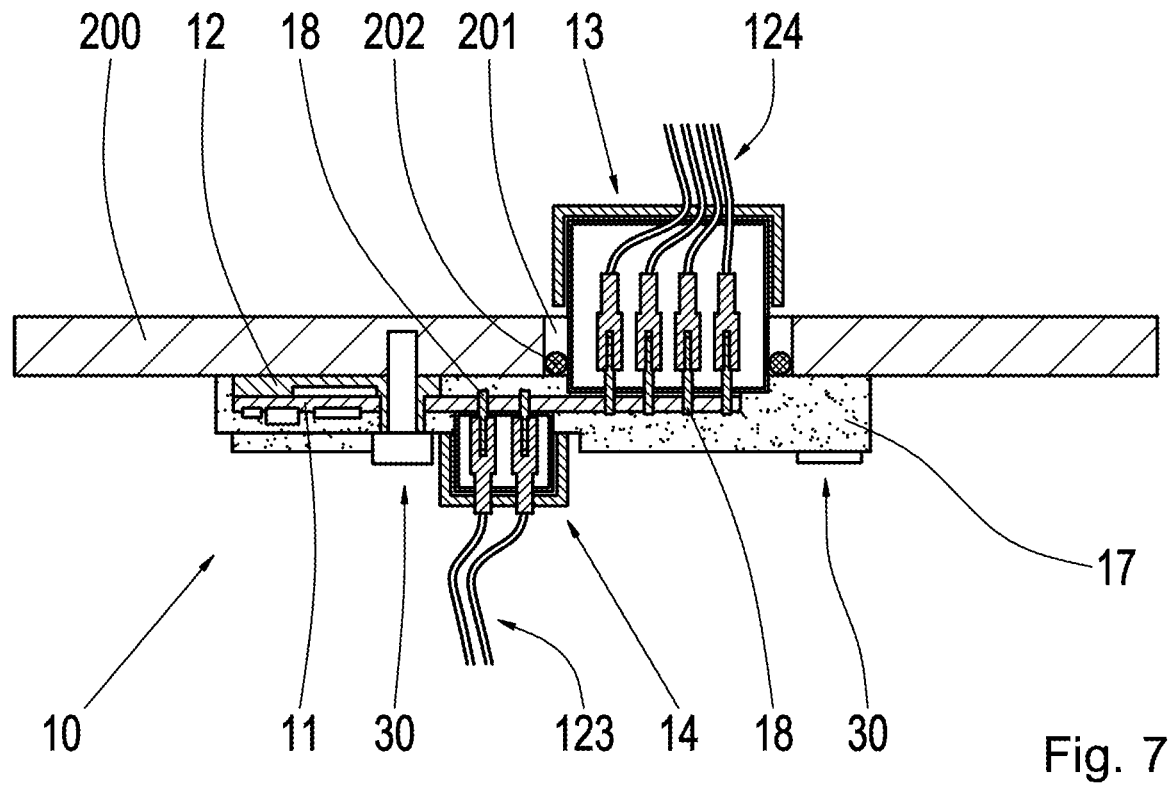
FIG. 7 shows a sectional view through the points A-A from the FIGS. 2 and 3 of a control unit installed at a transmission housing according to a further embodiment of the present disclosure.
Figure 8:
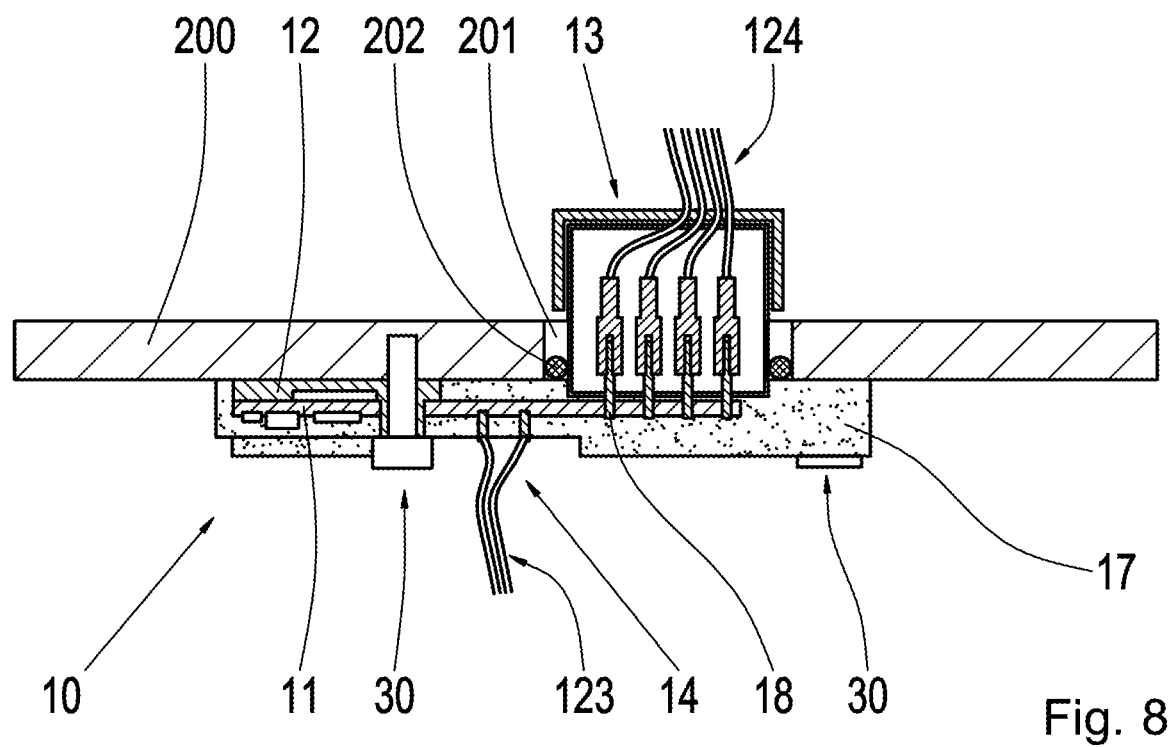
FIG. 8 shows a sectional view, as in FIG. 7, of a control unit installed at a transmission housing according to an alternative embodiment of the present disclosure.

In the embodiment in which control unit 10 is arranged on the inner side on housing 200 i.e. on the inner side of the transmission, i.e. on the transmission side, the depicted side of the control unit here is also the side that is facing away from the housing surface 200 i.e. the plug is the transmission sided plug 14. This embodiment is illustrated in FIG. 7. FIG. 8 shows an embodiment in which no transmission sided plug is used, but rather where the transmission sided components are directly connected to the circuit board.

In the following, the general design structure of control unit 10 is described, which can be used for such applications in which the control unit is attached to the outer side of the housing, as well as for such, in which the control unit is attached to the inner side of the housing.

The side of control unit 10 that is shown in FIG. 2 features a plug 13 or 14 with corresponding pins 18, which can accommodate a corresponding mating plug. The arrangement of plug 13 or 14 is selected in such a way that it is not directly positioned opposite to the plug 13 or 14 that is shown in FIG. 3, i.e. the plugs would be in the way of each other, but in such a way that short conducting paths could still be advantageously realized via e.g. conducting paths between the plugs 13 and 14. The arrangement of the plug 13 or 14, as it is depicted in FIG. 2, depends on the structural shape and the space it requires as well as on the application and it is accordingly specified by an expert.

The side of the control unit shown in FIG. 2 furthermore features bore holes or screw-on locations 16, in order to screw the control unit to housing 200. The amount of bore holes should be selected in such a way, that it results in a stable connection between control unit 10 and housing 200. For example, three bore holes 16 are suitable to accomplish this, however it is also possible to choose only two or four or more bore holes 16. This has to be selected by an expert with reference to the application.

The circuit board of control unit 10 including the plug is further provided with an overmolding 17, in order to guarantee protection against external influences and at the same time, to provide at least a minimum reinforcement. The material of the overmolding 17 should be selected in such a way that it provides a secure sealing against fluids, in particular against oil. A suitable material for such an overmolding 17 is, for example, a thermoset.

Furthermore, several reinforcement ribs 15 are arranged on the depicted side of control unit 10 or within or on the overmolding 17 in this embodiment. Other structures than the depicted ribs can also be formed for a reinforcement. The ribs can be placed on the overmolding or they can be integrated within the overmolding 17. Alternatively, it is also possible to achieve a reinforcement by means of an additional mounting plate, which is fastened when control unit 10 is screwed onto housing 200.

As it is described in more detail later with reference to the FIGS. 7 and 8, no transmission sided plug 14 is necessary in the embodiment in which the control unit 10 is arranged within housing 200. It is much rather possible to attach the existing components inside of the transmission space, such as e.g. to attach the bus components or the power supply directly to the conducting paths of the circuit board, e.g. by means of soldering, pressing or other known and suitable procedures.

For reasons of cost-reduction, it is furthermore possible to reduce the number of pins 18 in the motor vehicle sided plug 13, e.g. to two pins for the power supply and two pins for the bus connection. Depending on the configuration, it is e.g. possible to install round or rectangular plugs with round pins or rectangular pins. The number of pins 18 and the type of plug 13 can be selected by an expert depending on the space requirement and application. The connection of the pins to the circuit board can be carried out e.g. by means of soldering or pressing.

FIG. 3 shows a top view of a control unit 10 from the opposite side to the one shown in FIG. 2 according to an embodiment of the present disclosure. In this embodiment, control unit 10 can be attached to housing 200, e.g. a transmission housing, from the outer side or from the inner side.

In the embodiment, in which control unit 10 is arranged on the outer side of housing 200, i.e. on the outer side of the transmission, or on the motor vehicle side, the side of the control unit 10 depicted in FIG. 3 is herein the side that is facing towards the housing surface 200, i.e. the side rests on the surface of housing 200, wherein the transmission sided plug 13 protrudes through opening 201 in housing 100. This is shown in the FIGS. 5 and 6 and described later.

In the embodiment in which control unit 10 is arranged on the inner side of housing 200 i.e. on the inner side of the transmission, i.e. on the transmission side, the depicted side of the control unit is here also the side that is facing towards the housing surface 200, wherein the motor vehicle sided plug 13 protrudes through opening 201 in housing 100. This embodiment is illustrated in FIGS. 7 and 8.

The side of control unit 10 that is shown in FIG. 3 features a plug which can accommodate a corresponding mating plug. The arrangement of the plug is selected in such a way that it is not directly positioned opposite to the plug that is shown in FIG. 2, so that it is not in the way of that one, but in such a way that short conducting paths can still be realized via e.g. conducting paths between the two plugs 13 and 14. As it was already mentioned above, the arrangement of the plug depends on the structural shape and the space it requires as well as on the application and it is accordingly specified by an expert.

Figure 4:
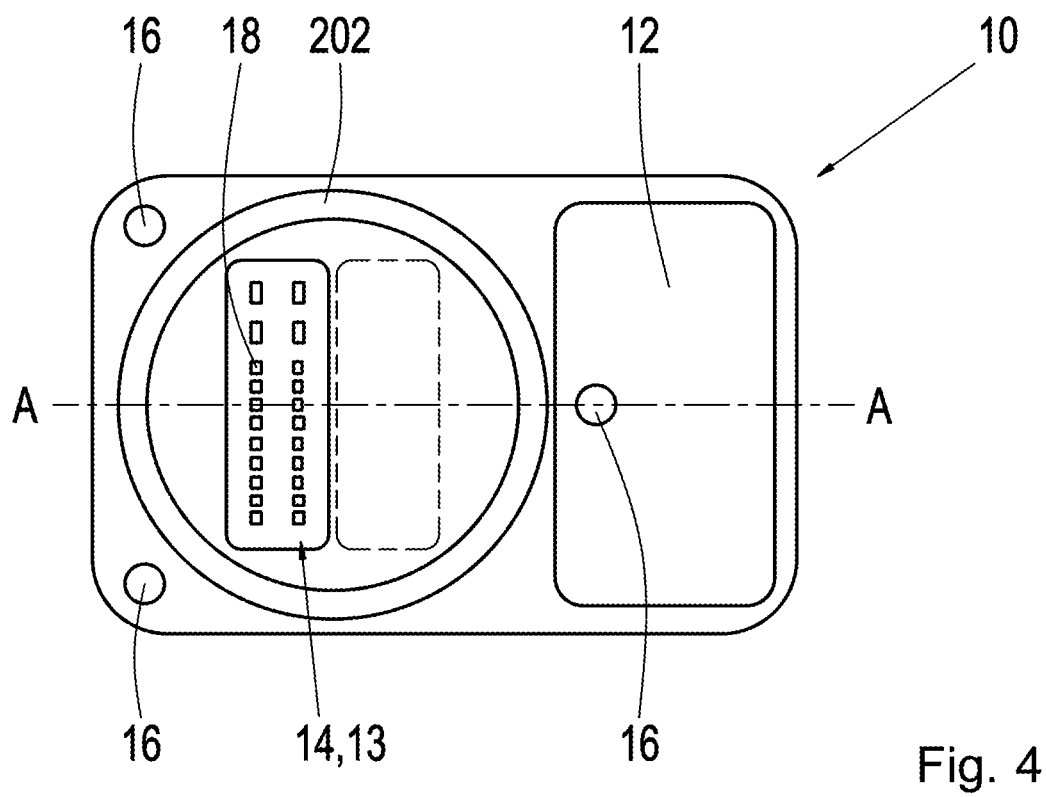
FIG. 4 shows a top view of a control unit from the side shown in FIG. 3 according to a further embodiment of the present disclosure.
Figure 6:
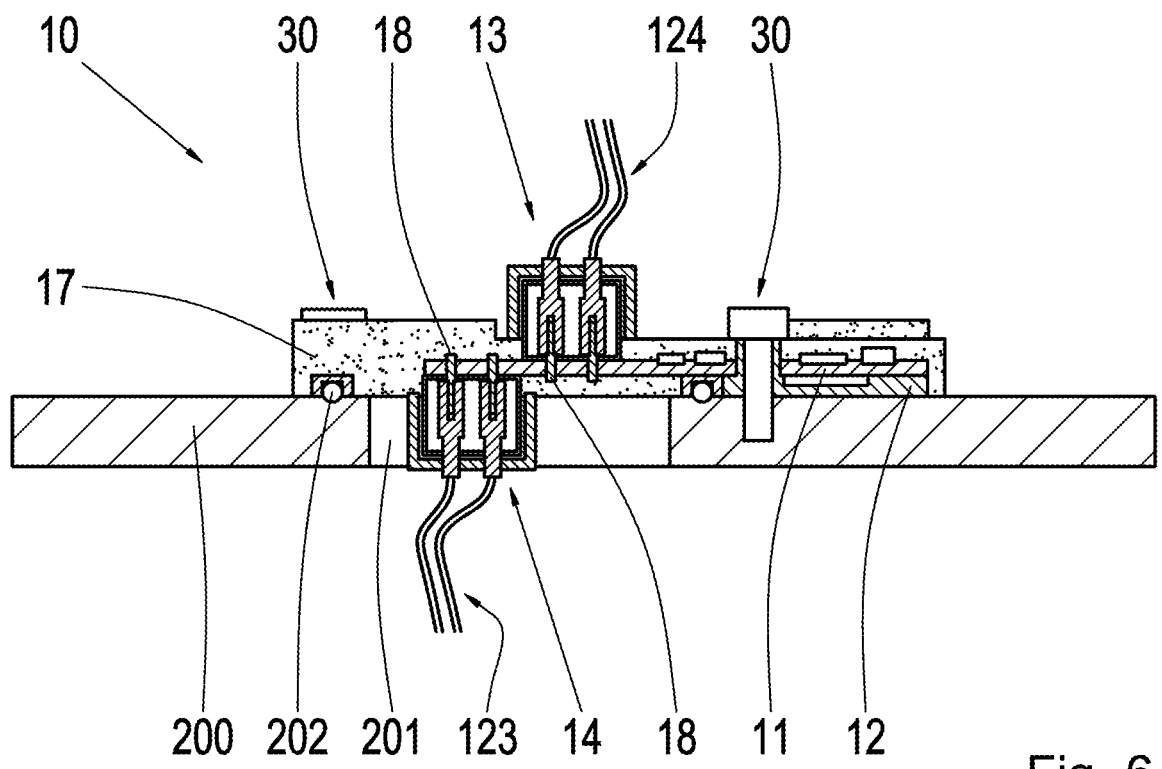
FIG. 6 shows a sectional view through the points A-A from the FIGS. 2 and 4 of a control unit installed at a transmission housing according to a further embodiment of the present disclosure.

In each embodiment, both plugs 13 and 14, i.e. the transmission sided and the motor vehicle sided plug, can be selected in such a way that both are arranged so close together that they are within the area of the bore hole for the opening for the plug 201 within the transmission housing 200, as it is depicted in the FIGS. 2 and 4 by the dashed line and in FIG. 6 in sectional view, so that it is possible to reduce the space requirement. This embodiment of plug 13 and 14 can also be selected for the embodiment of control unit 10, which is arranged on the inner side of housing 200, and which is not depicted in the figures.

The shape of plug 13 or 14 is advantageously selected in such a way, that it fits into an existing opening in the transmission housing 200, e.g. in the opening for the transmission plug 201 shown in FIG. 1, according to the prior art, and that plug 14 thus features a round shape. Alternatively, plug 13 and/or 14 can also feature a rectangular shape or any other suitable shape and be positioned in such a way, that the motor vehicle sided plug 13 can be arranged on the other side of the control unit directly adjacent to plug 14 within the existing bore hole or opening within the transmission housing 200, as it is depicted in the FIGS. 2 and 4. In this way a reduction of the space requirement is achieved. The selection of the shape of the plug 13 and 14 is dependent on the application. Depending on the configuration, plugs with round or rectangular pins can be used. The number and type of the pins as well as the type or shape of plug 13 and 14 can be selected by an expert depending on the space requirement and application. The connection of the pins to the circuit board can be carried out e.g. by means of soldering or pressing.

One respective sealing 202 is depicted in FIGS. 3 and 4, which can be designed as gasket or as cost-efficient O-ring, in order to ensure a sealing of plug 13 or 14 in addition to the overmolding 17 or between the opening 201 in transmission housing 200 and the components arranged therein, e.g. the motor vehicle sided and/or the transmission sided plug 13 or 14. The type of the sealing 202 is selected depending on the type or shape of the plug. For a round plug, one or more O-rings can be used as sealing 202. For a plug, which features a shape other than round, e.g. rectangular, a groove can be formed within the overmolding 17 outside of the opening 201 in the housing, into which a gasket can be inserted. The gasket can be injection molded into the groove or it can be arranged in it as a component. It should be made of a different material than the overmolding, preferably an elastic one. Depending on what type of plug has to be sealed, an axial or radial sealing can thus be carried out.

However, it is also possible that depending on the application, no additional sealing of the plug is desired or necessary.

Bore holes 16 are also depicted in the FIGS. 3 and 4, in order to screw the control unit to housing 200. These bore holes 16 correspond to the bore holes on the side depicted in FIG. 2, which means that they are located at the same place as the bore holes 16 in FIG. 2.

Bore holes 16 with the corresponding screw fittings 30, see in the FIGS. 5 to 8, feature the advantage that they can be loosened again, i.e. control unit 10 can be replaced. However, it is also possible to use other methods for attaching, e.g. gluing. The type of attaching is to be selected by an expert according to the application and is not limited to the mentioned types.

As it can be seen in the FIGS. 5 to 8, a cooling plate 12 is integrated in the area of the circuit board 11 of control unit 10, in which the electronic components are arranged on the side that is adjacent to the housing surface 200, which is aligned at a metal surface at the unit or at the housing surface 200 in order to dissipate the heat loss. The electronic components can be fitted onto circuit board 11 on one side or on both sides. Depending on the available construction space, circuit board 11 can also be installed over depth milled areas in a bent manner in various angles.

Figure 5:
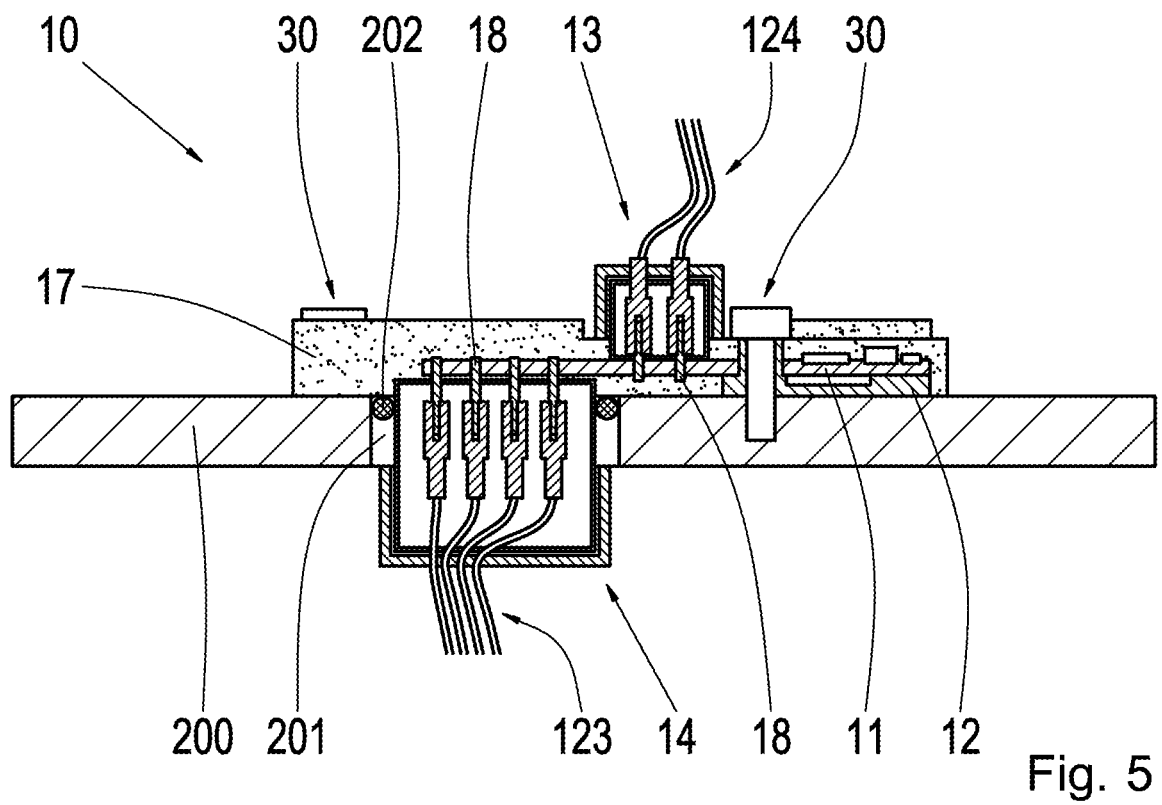
FIG. 5 shows a sectional view through the points A-A from the FIGS. 2 and 3 of a control unit installed at a transmission housing according to an embodiment of the present disclosure.

The FIGS. 5 and 6 depict a respective sectional view through the points A-A of a control unit 10 that is installed on the outer side of a transmission housing 200, as it was already described with reference to the FIGS. 2 to 4, wherein the same reference signs describe the same components and will not be repeated individually in detail.

Pins 18 of the plugs 13, 14 are directly connected to the corresponding conducting paths (not depicted) of the circuit board. This result in the short signal paths.

FIG. 5 shows the embodiment in which the transmission sided plug 14 is designed as a round plug and is fitted into the opening of housing 201. FIG. 6 shows the embodiment in which the transmission sided plug 14 features the same embodiment as the motor vehicle sided plug 13, which means in this case an elongated rectangular design, so that both plugs are arranged within the area of opening 201 in the housing, however on opposite sides of control unit 10.

Additionally, screw fittings 30 are depicted in the FIGS. 5 and 6, which are guided through the bore holes 16 on the upper and lower side of control unit 10 and which attach control unit 10 to housing 200. The type of screw fittings 30 can be selected in any desired manner, as long as the desired connection between control unit 10 and housing 200 is established.

It can further be seen in FIG. 5, that sealing 202 is arranged between plug 14 and the housing wall within opening 201 in the housing. However, in FIG. 6, sealing 202 is arranged outside of opening 201 in the housing, since no round plug is used in this embodiment, in which it is possible to carry out a sealing by means of one or more O-rings. As it was described above, the selection of the type of sealing 202 depends on the type and shape of the plug(s).

The FIGS. 7 and 8 depict a sectional view through the points A-A of a control unit 10 on the inner side of transmission housing 200 according to an embodiment of the present disclosure. The same reference signs are used for the same components as for the previous figures and their description is not repeated individually in detail.

In contrast to the embodiment shown in the FIGS. 5 and 6, control unit 10 is arranged inside of housing 200 in this embodiment. As it can be seen in the FIGS. 7 and 8, cooling plate 12 is arranged in the same way as it is also in the FIGS. 5 and 6 on the side of the control unit, which is facing towards the housing, in order to cool the electronic components that are arranged on circuit board 11. Screw fittings 30 are designed in the same way as in the FIGS. 5 and 6, which means that they are guided through the bore holes in order to attach control unit 10 to the housing. The only difference is that the attaching of the screws 30 is carried out through the bore holes 16 from the inner side of housing 200, wherein also other screw fittings can be chosen which are attached from the motor vehicle side.

As it was also described earlier with regard to the transmission sided plug 14, the motor vehicle sided plug 13 can be guided through opening 201 in housing 200 and be sealed with a sealing 202, e.g. a gasket or one or more O-rings. Circuit board 11 can be populated with components on one or both sides and is protected against external influences by means of an overmolding 17 as in the other embodiments.

Furthermore, a transmission sided plug 14 is depicted in FIG. 7, which is not necessarily required in this embodiment. Rather, a connection to the sensors, actuators, etc. that need to be connected to the control unit within the transmission can be carried out directly to the circuit board e.g. by means of soldering, pressing or other known and suitable procedures, as it is shown in FIG. 8. Thus, less components are required, and a cost-efficient system can be implemented.

For the embodiments shown in the FIGS. 7 and 8, it is also possible to design the motor vehicle sided plug 13, not in a round manner, but e.g. in a rectangular manner, as in the previous embodiments. The shape of plug 13 is not limited—any plug 13 or plug shape that is suitable for the corresponding application can be used. Both in the embodiment with a motor vehicle sided and with a transmission sided plug 13 and 14, as well as in the embodiment without the transmission sided plug 14, the plug(s) can be arranged as it was the case in the FIGS. 2 and 4 within the area of the housing opening 201 on opposite sides, in order to save space.

The present disclosure features several advantages when compared to known control units for the installation at housings, in particular transmission housings. It is e.g. possible to use simple, cost-efficient, non-sealed plugs with flat pins, or, in order to provide an oil sealing, a sealing of the pins 18 can be carried out by means of a thermoset overmolding in combination with a gasket or with one or more O-rings. This means that both axial as well as radial sealings can be implemented.

Furthermore, a significant reduction of individual components or a reduction of components that are made available by suppliers is possible, so that costs can be saved as a result.

In addition to this, a reduction of the cable set between the connection of the transmission and installed control unit is made possible, since conducting paths within the circuit board can serve as connection.

An optimal thermal connection for heat dissipation can be achieved by means of the structural shape, since only a small cooling area is necessary or since a formation of 3D-structures is partially possible by means of depth milling.

By means of the option that the control unit can—but does not have to be installed within the transmission, an optimal space usage can be achieved. For example, it is not necessary to reserve further space for the electronic within the transmission area, since it is integrated into the control unit, wherein the control unit only requires a minimum installation space.

LIST OF REFERENCE SIGNS 10, 100 (Attachable) control unit
11 Circuit board
12 Cooling plate
13 Motor vehicle sided plug
14 Transmission sided plug
15 Reinforcement ribs
16 Screw-on locations
17 Overmolding
18 Pins
200 Transmission housing or transmission housing wall
201 Opening in the transmission housing for the transmission plug
202 Sealing
120 Transmission plug
130 Plug sockets for motor vehicle sided and transmission sided plugs
123 Cable set towards transmission
124 Cable set towards motor vehicle
30 Screw fitting

The invention claimed is:

1. A control unit, comprising a transmission control unit further comprising:
    a circuit board configured to be located outside of a housing, the housing having an inner side and an outer side; and
    at least one plug located on the circuit board and comprising a plurality of pins connected to corresponding conducting paths of the circuit board, the at least one plug having a defined shape and arrangement of pins and being configured to mate with a mating plug having a corresponding shape to the shape of the at least one plug and having a plurality of contacts in a corresponding arrangement configured to connect to the plurality of pins of the at least one plug, wherein the at least one plug is configured to protrude from the outer side of the housing directly into an opening within the housing to expose the pins to be able to mate with the mating plug on the inner side of the housing, and to produce at least one of an electrical connection or a signal connection between the outer side and the inner side of the housing via the plurality of pins; and
    a molded housing enclosing at least the circuit board and the at least one plug,
    wherein the control unit is configured to be attached to the outer side of the housing.

2. The control unit according to claim 1, wherein the at least one plug is a transmission sided plug.

3. The control unit according to claim 2, wherein the circuit board further comprises a motor vehicle sided plug located on the opposite planar side of the circuit board as the transmission sided plug.

4. The control unit according to claim 3, wherein the transmission sided plug is positioned not to be directly opposite the motor vehicle sided plug on the circuit board.

5. The control unit according to claim 1, wherein the at least one plug that protrudes through the opening in the housing is enclosed by means of a sealing.

6. The control unit according to claim 5, wherein the sealing comprises at least one of an O-ring or a gasket that is arranged in a groove of the molded housing.

7. The control unit according to claim 5, wherein the sealing is arranged outside of the opening in the housing.

8. The control unit according to claim 1, wherein the circuit board comprises at least one of electric components or electronic components that are arranged on the circuit board, and wherein a cooling device is arranged in a vicinity of the at least one of the electric components or the electronic components on a side of the circuit board that faces towards the housing.

9. The control unit according to claim 8, wherein the cooling device is a cooling plate.

10. The control unit according to claim 9, wherein the cooling plate is integrated in the circuit board and disposed adjacent to a metal surface on at least one of the control unit or the housing.

11. The control unit according to claim 8, wherein the at least one of the electric components or the electronic components are disposed on both sides of the circuit board.

12. The control unit according to claim 1, wherein the at least one plug is configured to protrude through an existing opening in the housing.

13. The control unit according to claim 1, further comprising a plurality of reinforcement ribs disposed on a side of the control unit facing away from the housing.

14. A control unit comprising a transmission control unit further comprising:
  a circuit board; and
  at least one plug located on the circuit board and comprising a plurality of pins connected to corresponding conducting paths of the circuit board, the at least one plug having a defined shape and arrangement of pins and being configured to mate with a mating plug having a corresponding shape to the shape of the at least one plug and having a plurality of contacts in a corresponding arrangement configured to connect to the plurality of pins of the at least one plug, wherein the at least one plug is configured to protrude directly into an opening within a housing having an inner side and an outer side, and to produce at least one of an electrical connection or a signal connection between the outer side and the inner side of the housing via the plurality of pins, wherein the plurality of contacts of the mating plug also protrude directly into the opening within the housing to mate with the plurality of pins;
  a molded housing enclosing at least the circuit board and the at least one plug; and
  a cooling plate integrated in the circuit board in a vicinity of at least one electronic component on a side of the circuit board that faces toward the housing and disposed adjacent to a metal surface on at least one of the control unit or the housing, wherein the control unit is configured to be attached to the inner side of the housing and the at least one plug is a motor vehicle sided plug.

15. The control unit according to claim 14, wherein the circuit board further comprises a transmission sided plug located on the opposite planar side of the circuit board as the motor vehicle sided plug.

16. The control unit according to claim 15, wherein the transmission sided plug is positioned not to be directly opposite the motor vehicle sided plug on the circuit board.

17. The control unit according to claim 15, wherein the motor vehicle sided plug and the transmission sided plug are shaped the same.

18. The control unit according to claim 14, wherein conducting paths of the control unit are directly connected to transmission sided components in an interior of the housing.

19. The control unit according to claim 18, wherein the connection between the conducting paths and the transmission sided components in the interior of the housing is carried out by means of at least one of soldering, pressing, or welding.

20. The control unit according to claim 19, wherein the signal connections comprise connections for at least one of a bus, a sensor, an actuator, a valve, a motor, a voltage supply or a power supply.

* * * * *